(12) United States Patent
Chen

(10) Patent No.: US 12,456,646 B2
(45) Date of Patent: Oct. 28, 2025

(54) METHODS FOR FORMING DEEP TRENCH ISOLATION STRUCTURES

(71) Applicant: Applied Materials, Inc., Santa Clara, CA (US)

(72) Inventor: Taichou Papo Chen, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 599 days.

(21) Appl. No.: 17/736,177

(22) Filed: May 4, 2022

(65) Prior Publication Data
US 2023/0230872 A1     Jul. 20, 2023

(30) Foreign Application Priority Data

Jan. 20, 2022  (WO) ................ PCT/US2022/013042

(51) Int. Cl.
*H01L 21/762* (2006.01)
*H10F 39/00* (2025.01)

(52) U.S. Cl.
CPC ..... *H01L 21/76224* (2013.01); *H10F 39/024* (2025.01); *H10F 39/807* (2025.01)

(58) Field of Classification Search
CPC ............... H01L 21/76; H01L 21/76224; H01L 21/76264; H01L 21/76213; H10D 84/0151; H10D 84/0188; H10F 39/807; B81C 1/00063; B81B 2203/0315
See application file for complete search history.

(56) References Cited

U.S. PATENT DOCUMENTS

| 5,700,712 | A | * | 12/1997 | Schwalke | ........... H01L 21/2255 257/E21.151 |
| 8,470,684 | B2 | | 6/2013 | Pei et al. | |
| 8,502,308 | B2 | | 8/2013 | Schrems et al. | |
| 9,508,769 | B1 | * | 11/2016 | Li | ........ H10F 39/8053 |
| 10,546,937 | B2 | | 1/2020 | Singh et al. | |
| 2004/0082140 | A1 | * | 4/2004 | Yang | ..................... H01L 21/763 257/501 |

(Continued)

FOREIGN PATENT DOCUMENTS

KR       20010016837 A  *  8/1999

OTHER PUBLICATIONS

PCT International Search Report and Written Opinion for PCT/US2022/013042 dated Oct. 20, 2022.

*Primary Examiner* — Chad M Dicke
*Assistant Examiner* — Jeremy Daniel Watts
(74) *Attorney, Agent, or Firm* — Moser Taboada

(57) ABSTRACT

Methods for forming a deep trench isolation (DTI) structure with only two interfaces. In some embodiments, a method of forming a deep trench isolation structure may include etching a trench with a high aspect ratio into a substrate material, repairing the surfaces of the trench from damage caused by etching of the trench, growing an epitaxial layer on the surfaces of the trench to form a homogeneous passivation region as part of the substrate material, doping the epitaxial layer with a dopant to form a passivation charge region, performing a charge diffusion process to embed the dopant into the substrate material, forming a conformal liner layer on the homogeneous passivation region in the trench, and filling the trench with an optically reflective material.

13 Claims, 8 Drawing Sheets

(56) References Cited

U.S. PATENT DOCUMENTS

| | | | | |
|---|---|---|---|---|
| 2015/0179503 A1* | 6/2015 | Tsai | ................... | H10D 30/6211 |
| | | | | 438/433 |
| 2015/0243697 A1 | 8/2015 | Chien et al. | | |
| 2017/0358620 A1 | 12/2017 | Chen et al. | | |
| 2017/0373117 A1* | 12/2017 | Chou | ................... | H10F 39/807 |
| 2020/0219912 A1 | 7/2020 | Ro et al. | | |
| 2020/0243582 A1* | 7/2020 | Li | ................... | H01L 21/76224 |
| 2021/0193704 A1 | 6/2021 | Sun | | |
| 2022/0223634 A1* | 7/2022 | Yang | ................... | H10F 39/18 |
| 2023/0170373 A1* | 6/2023 | Noh | ................... | H10F 39/199 |
| | | | | 257/432 |

* cited by examiner

METHODS FOR FORMING DEEP TRENCH ISOLATION STRUCTURES

CROSS-REFERENCE TO RELATED APPLICATIONS

This application claims priority to International Patent Application No. PCT/US2022/013042, filed Jan. 20, 2022, and entitled "METHODS FOR FORMING DEEP TRENCH ISOLATION STRUCTURES", the contents of which are hereby incorporated by reference in its entirety.

FIELD

Embodiments of the present principles generally relate to semiconductor processing of semiconductor substrates.

BACKGROUND

Optoelectronic devices are formed on substrates in close proximity to each other. Trenches are often created in between the devices to facilitate in maintaining incoming light waves in each device. Color filters limit the wave lengths of each device. The inventor has found that if wave lengths of an adjacent pixel are allowed to enter another pixel with a different color filter, the light waves would create unwanted noise in the adjacent pixel, lowering that pixel's signal-to-noise ratio (SNR) and performance. Adequately separating the pixels optically becomes even more challenging as the aspect ratio increases, causing a corresponding drop in SNR and poor performance.

Accordingly, the inventor has provided improved processes and structures for deep trench isolation of pixels that substantially increases pixel performance.

SUMMARY

Methods and structures for improved deep trench isolation of are provided herein.

In some embodiments, a method of forming a deep trench isolation (DTI) structure in a substrate may comprise etching a trench with a high aspect ratio into a substrate material, repairing surfaces of the trench from damage caused by etching of the trench, growing an epitaxial layer on surfaces of the trench to form a homogeneous passivation region as part of the substrate material, doping the epitaxial layer with an additional dopant to engineer a passivation charge region, performing a charge diffusion process to embed the additional dopant into the substrate material, forming a conformal liner layer or a conformal barrier layer on the homogeneous passivation region in the trench, and filling the trench with an optically reflective material.

In some embodiments, the method may further comprise wherein the charge diffusion process is a millisecond anneal process or oxidation process, repairing surfaces of the deep trench by: forming a dry oxide on surfaces of the trench and selectively removing the dry oxide from surfaces of the trench, wherein the additional dopant is boron, wherein the conformal liner layer or the conformal barrier layer is silicon dioxide, wherein the homogeneous passivation region is formed by single crystal epitaxial growth or by oxidizing non-crystal doped material, oxidizing the epitaxial layer or the non-crystal doped material with the additional dopant in a condensation process to embed the additional dopant and to form the conformal liner layer or the conformal barrier layer, depositing a refractive layer on the conformal liner layer or the conformal barrier layer before filling the trench with the optically reflective material and selectively removing a portion of the refractive layer from inside of the trench before filling the trench with the optically reflective material, removing portions of the optically reflective material from a field of the substrate using a patterning process after filling the trench with the optically reflective material, and/or forming a color filter layer or an optical barrier layer on the field of the substrate.

In some embodiments, a non-transitory, computer readable medium having instructions stored thereon that, when executed, cause a method for forming a deep trench isolation (DTI) structure in a substrate to be performed, the method may comprise etching a trench of the DTI structure with a high aspect ratio into a substrate material, repairing surfaces of the trench from damage caused by etching of the trench, growing an epitaxial layer on surfaces of the trench to form a homogeneous passivation region of the DTI structure as part of the substrate material, doping the epitaxial layer with a dopant to form a passivation charge region of the DTI structure, performing a charge diffusion process to embed the dopant into the substrate material, forming a conformal liner layer of the DTI structure on the homogeneous passivation region in the trench, and filling the trench with an optically reflective material.

In some embodiments, the method on the non-transitory, computer readable medium may further comprise depositing a refractive layer on the conformal liner layer before filling the trench with the optically reflective material, selectively removing a portion of the refractive layer from inside of the trench before filling the trench with the optically reflective material, removing portions of the optically reflective material from a field of the substrate using a patterning process after filling the trench with the optically reflective material, and forming a color filter layer or an optical barrier layer on the field of the substrate after performing the patterning process, and/or repairing the surfaces of the trench by: forming a dry oxide on the surfaces of the trench and selectively removing the dry oxide from the surfaces of the trench, using a millisecond anneal process as the charge diffusion process, and wherein the dopant is boron, the conformal liner layer is silicon dioxide, and the epitaxial layer is formed of single crystals.

In some embodiments, a deep trench isolation (DTI) structure formed in a substrate may comprise a trench of the DTI structure etched into a first dielectric material on the substrate, wherein the trench has a high aspect ratio; a homogeneous passivation region of the DTI structure formed as part of the first dielectric material on surfaces of the trench, wherein the homogeneous passivation region is optically transparent, a liner layer of the DTI structure of a second dielectric material conformally formed on the homogeneous passivation region, and an optically reflective material of the DTI structure filling the trench, wherein the homogeneous passivation region, the liner layer, and the optically reflective material form the DTI structure and wherein only two interfaces of differing materials are formed in the DTI structure between any adjacent pixel and the optically reflective material, a first interface between the optically reflective material and the liner layer and a second interface between the liner layer and the homogeneous passivation region formed as part of the first dielectric material.

In some embodiments, the deep trench isolation structure may further comprise wherein the optically reflective material is aluminum, wherein the second dielectric material is silicon dioxide, wherein the DTI structure has an abrupt charge passivation region immediately adjacent to the homogeneous passivation region that is configured to alter a work function of the DTI structure, wherein the abrupt charge passivation region has a charge formation of plus or minus approximately $3e18/cm^3$ to approximately $3e21/cm^3$, wherein the high aspect ratio is at least approximately 75:1, a refractive layer formed on a field of the substrate immediately adjacent to the optically reflective material and at least one color filter layer formed on the refractive layer immediately adjacent to the optically reflective material.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
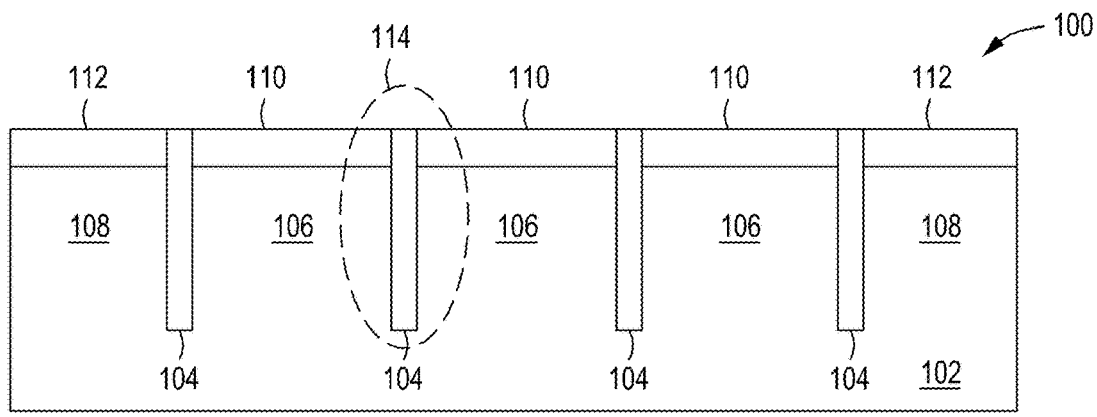
FIG. 1 depicts a cross-sectional view of optical pixels in a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and structures provide a high-performance deep trench isolation solution that dramatically increases the signal-to-noise (SNR) of associated pixels. The deep trench isolation (DTI) structures are formed with fewer optical interfaces between the pixel and reflective material of the DTI structure to increase the amount and intensity of reflected light waves from the DTI structure back into adjacent pixels, increasing SNR performance of the pixels. The reduction in interfaces also means a reduction in layers which allows for increased high aspect ratios of the DTI structures, allowing for increased densities of pixels without loss of pixel performance (or even increased performance with higher densities in some cases). Refraction materials are used only on the field surfaces of the substrate in the DTI structure which further reduces optical interfaces, retaining refraction materials only where the refraction materials are needed. Performance of the DTI structure is further improved by creating an abrupt charge passivation region which permits larger usable effective pixel area between DTI structures, enabling, for example, high dynamic range (HDR) capabilities of the pixels.

The DTI structure of the present principles utilizes new materials and film properties to simplify interfaces and structure complexity. New engineering methods for damage repair, damage free layer formation, work function engineering, and refraction and reflection layers on selective areas are leveraged to yield high performance HAR DTI structures. Advantages include higher SNR performance by simplified structure versus higher photon losses by more complex structure designs. Higher carrier mobility is achieved by higher charge using a homogeneous layer formation than by lower charge using heterogeneous films. A homogeneous layer also has the advantage of no optical penalty versus a heterogeneous layer with high optical penalty. Further advantages are achieved by forming refractive and reflective layers selectively only in needed areas. In addition, the DTI structure also strongly favors device scaling as fewer layers are found in the structure, minimizing required space, allowing for increased HARs.

Optoelectronic devices involve photon transmission, reflection, refraction, and absorption elements. Conventional structures do not separate different purposed layers comprehensively and live with capability trade-offs. The present methods form structures with layers and treatments of desired functions only at needed structure areas for achieving higher signal-to-noise ratios. FIG. 1 depicts a cross-sectional view 100 of optical pixels 106 in a substrate 102 in accordance with some embodiments. DTI structures 104 of the present principles have been formed between the optical pixels 106 and non-pixel areas 108. Color filters 110 are formed on the optical pixels 106 to allow only certain light wavelengths into the optical pixels 106. Optical barrier layers 112 are formed on non-pixel areas 108 to limit unwanted noise from photons entering the substrate outside of pixel areas. FIGS. 3A-3N depict formation of a DTI structure 104 such as example 114 of FIG. 1 and are referenced in conjunction with a method 200 of FIG. 2. The DTI structure 104 serves two purposes—one is to prevent electrical crosstalk between pixels and the second is to prevent optical crosstalk between pixels. By using reflective material in the DTI structure 104, the DTI structure 104 has the potential of reflecting light back into a pixel to increase the pixel's performance by increasing the pixel's quantum efficiency (QE).

Figure 2:
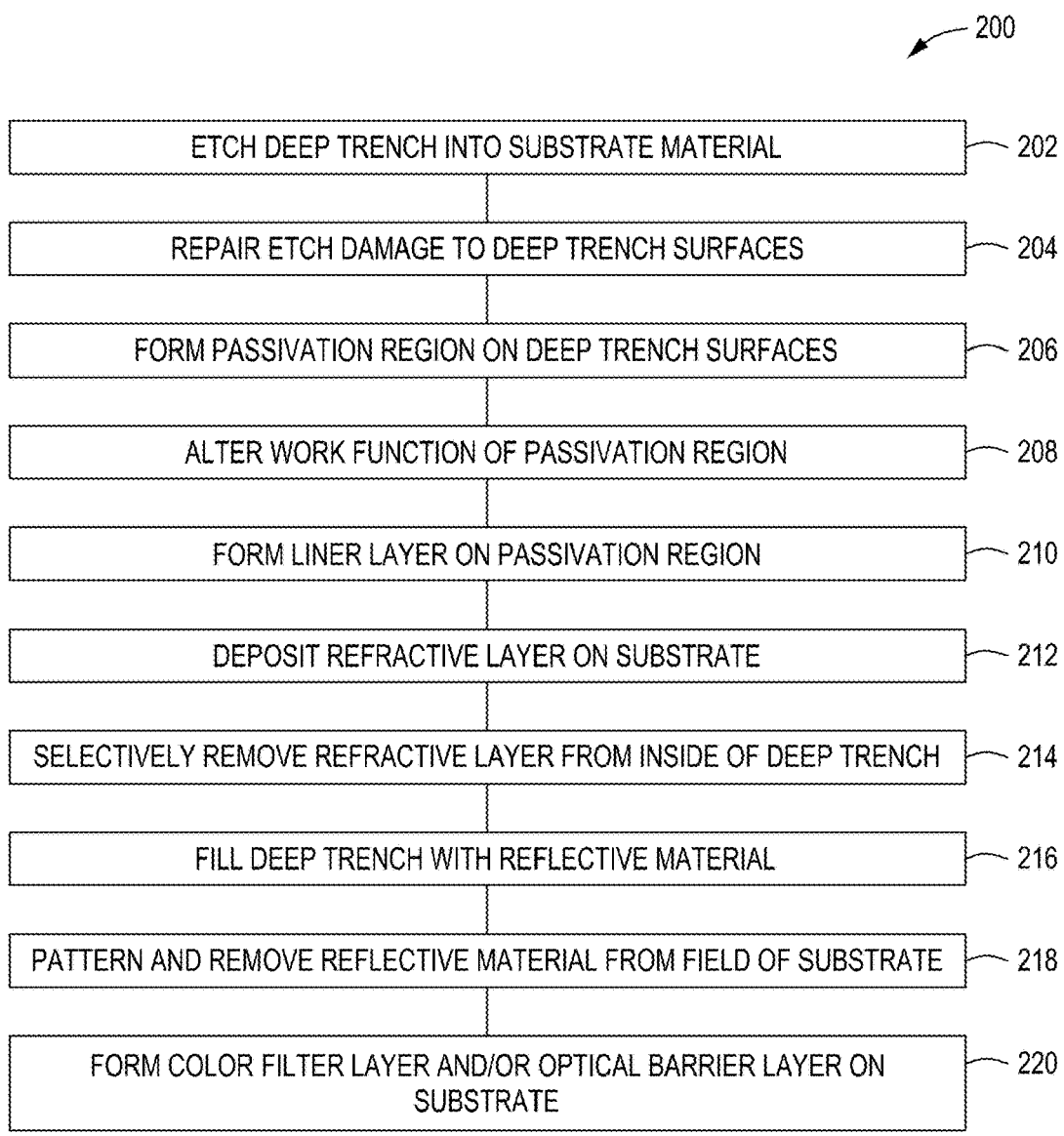
FIG. 2 is a method of forming a deep trench isolation structure in a substrate in accordance with some embodiments of the present principles.
Figure 3A:
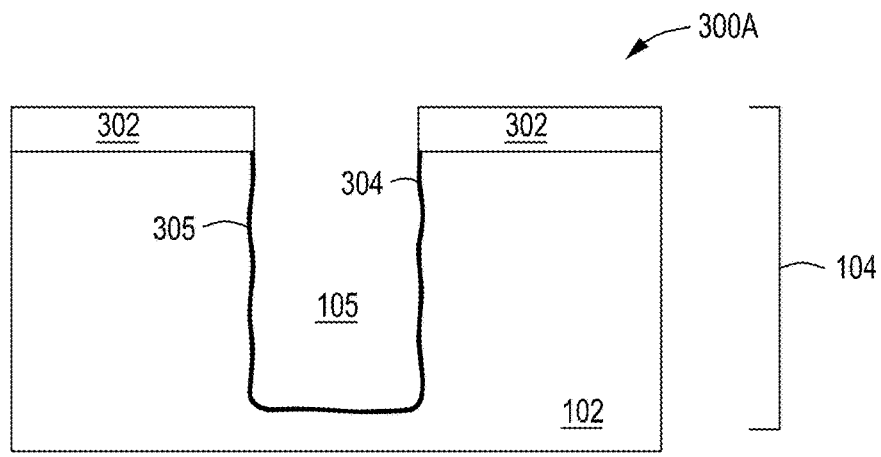
FIG. 3A depicts a cross-sectional view of a deep trench isolation structure after an etching process in accordance with some embodiments of the present principles.

FIG. 2 is a method 200 of forming a deep trench isolation structure 104 in a substrate 102 in accordance with some embodiments. In block 202, an etching process forms a deep trench 105 into the substrate 102 as depicted in view 300A of FIG. 3A. The etching process typically uses a hardmask layer 302 that protects areas from the etching process. In some embodiments, the aspect ratio of the deep trench 105 is at least approximately 50:1. In some embodiments, the aspect ratio of the deep trench 105 is at least approximately 75:1. In some embodiments, the aspect ratio of the deep trench 105 is at least approximately 100:1. As a side effect of the etching process, damage 304 occurs to the surfaces 305 of the deep trench 105. The damage 304 may include crystal damage of the substrate material, contaminants or residue from the etching process, and/or dangling bonds of the substrate material and the like. The hardmask layer 302 is removed after the etching process is completed.

Figure 3B:
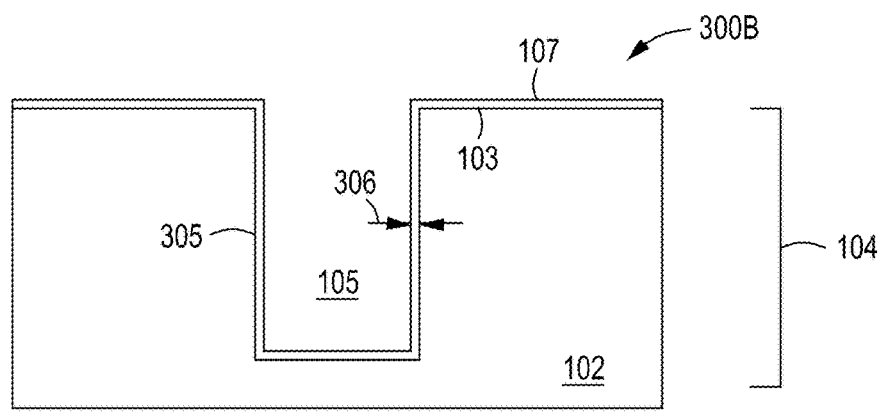
FIG. 3B depicts a cross-sectional view of a deep trench isolation structure after a dry oxide process in accordance with some embodiments of the present principles.

In block 204, the damage 304 to the surfaces 305 of the deep trench 105 is repaired. As depicted in a view 300B of FIG. 3B, the field 103 or top surfaces of the substrate 102 and the surfaces 305 of the deep trench 105 undergo a dry oxidation process to form an oxidation layer 107 that partially consumes the material of the substrate 102 including damaged portions. The dry oxidation process can be performed at temperatures of less than 450 degrees Celsius and produce less contamination and residue when compared to wet oxidation processes. In addition, dry oxidation processes can be used in substantially higher aspect ratio structures (e.g., greater than 100:1 aspect ratios) than wet oxidation (e.g., less than 50:1 aspect ratios). In some embodiments, the dry oxidation process is performed with a plasma oxidation chamber with or without a remote plasma source. The dry oxidation process facilitates in embedding oxygen into the surfaces 305 of the deep trench 105 to repair damage to the surfaces 305 and reduce stress induced leakage current (SILC) and interface trap densities ($D_{it}$).

Figure 3C:
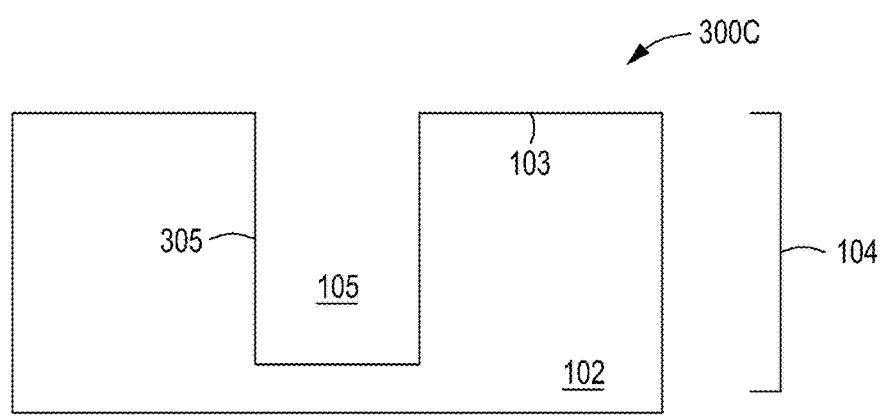
FIG. 3C depicts a cross-sectional view of a deep trench isolation structure after a selective oxide removal process in accordance with some embodiments of the present principles.

The dry oxidation process can also be controlled to provide different thicknesses 306 of the oxidation layer 107. Parameters such as exposure time, plasma density, temperature and the like can facilitate in determining an oxidation rate. The thickness is then controlled by the duration of the oxidation process. In conventional methods such as wet oxidation, the oxidizing process is self-limiting and oxide thicknesses cannot be adjusted. Wet oxidation typically stops at 1 nm to 2 nm of thickness at the saturation point. Dry oxidation does not have a saturation point and is not self-limiting allowing any level of thickness to be obtained. In some embodiments, the dry oxidation processes can achieve conformality in the deep trench 105 of greater than 95% for trenches with an aspect ratio of greater than 100:1, enabling scaling of deep trench isolation structures using the present principles. As depicted in a view 300C of FIG. 3C, the oxidation layer 107 is then selectively removed from the substrate 102 and the deep trench 105. In some embodiments, plasma-based chambers can be used to selectively remove the oxidation layer 107 with selectivity ratios of, for example, greater than 50:1 (e.g., oxidation material to Si/SiGe material). The selective removal of the oxidation removes all of the oxidation without damaging any of the underlying material of the substrate or creating contaminants/residue, leaving damage free surfaces of the deep trench 105.

Figure 3D:
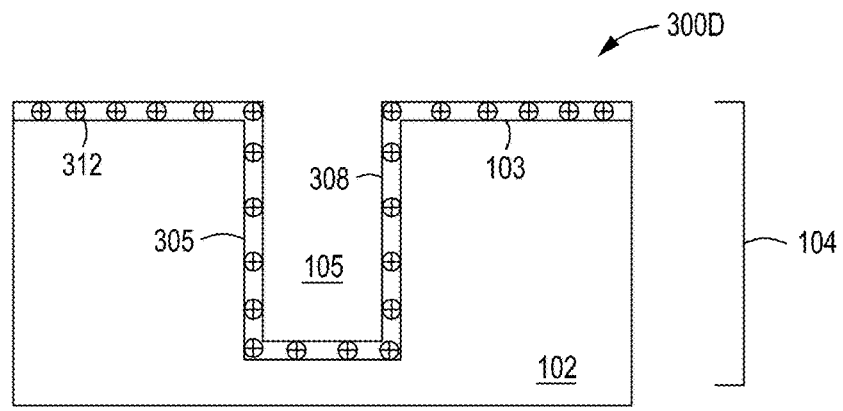
FIG. 3D depicts a cross-sectional view of a deep trench isolation structure after a forming a passivation region in accordance with some embodiments of the present principles.
Figure 5A:
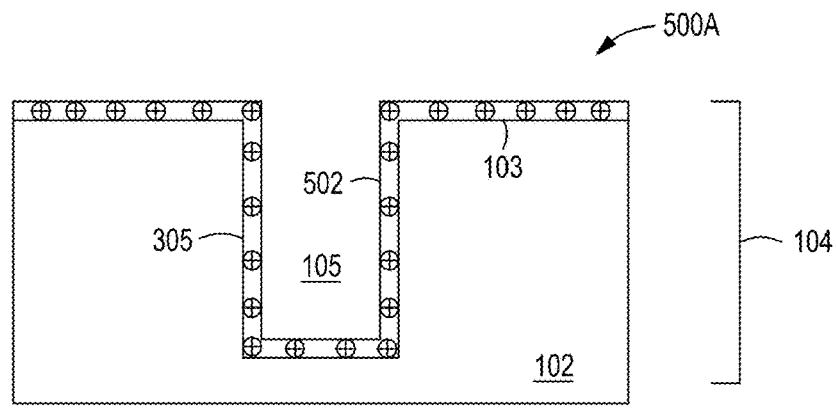
FIG. 5A depicts a first process of a second approach in accordance with some embodiments of the present principles.
Figure 5B:
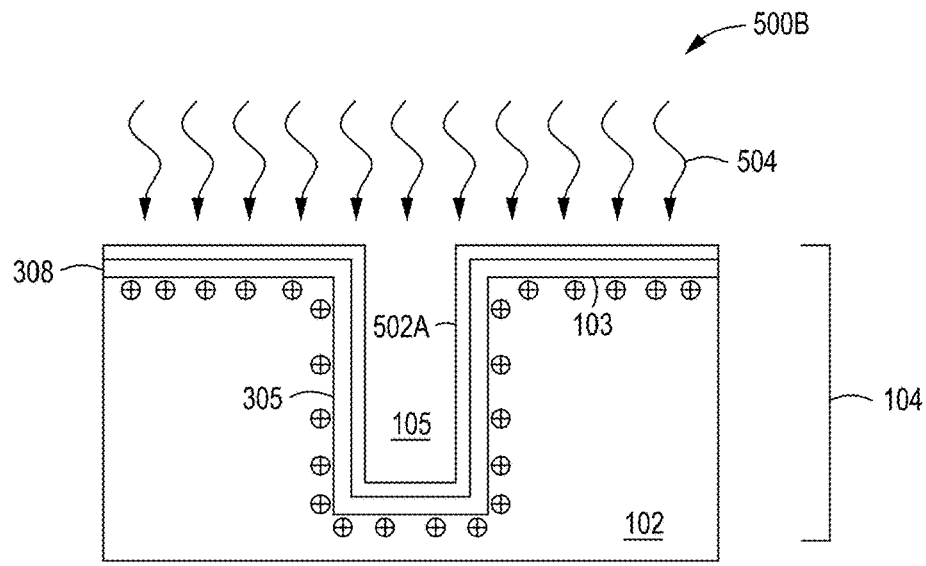
FIG. 5B depicts a second process of a second approach in accordance with some embodiments of the present principles.

In block 206, a passivation region 308 is formed on the surfaces 305 of the deep trench 105 and the field 103 of the substrate 102 as depicted in a view 300D of FIG. 3D. In some embodiments, the passivation region 308 is formed of homogeneous material similar to the material of the substrate 102. The passivation region 308 is formed by single crystals of the material with a species of dopants 312 (P-type species shown but not meant to be limiting) incorporated to form a positive charge or a negative charge (e.g., silicon doped with boron, gallium, phosphor, arsenic, etc.) on the substrate 102 and can be fabricated by two approaches. The first approach is with a low temperature epitaxial growth process using temperatures of less than approximately 450 degrees Celsius. The second approach is a two-part process in which the first part is to form a non-crystal doped material layer 502 on the field 103 as depicted in a view 500A of FIG. 5A followed by a second part including a material engineering process such as oxidation or thermal treatment 504 to drive dopant diffuse from the non-crystal doped material layer 502 into substrate 102 surface as depicted in a view 500B of FIG. 5B. The non-crystal doped material layer 502 becomes an oxide layer 502A. The passivation region 308 is formed as single crystal material under the field 103.

In essence, with either approach, the single crystal homogeneous layer becomes part of the substrate material and does not form an interface between the passivation region 308 and the substrate 102, eliminating an interface commonly found in conventional processes. The passivation region 308 also does not have any optical penalty as photons pass through the passivation region 308 as the photons would through the material of the substrate 102 without any degradation or change in light path (refraction). The formation of the passivation region also serves in repairing dangling bonds of the surfaces 305 of the deep trench 105 caused during etching processes. In some embodiments, the passivation region 308 can also be formed with heterogeneous material incorporating species such as Ge, carbon, for the engineering of energy band, light sensitivity, etc. and with gradient transition from the material of the substrate 102 to passivation region 308 without any interface formation in between.

Figure 3E:
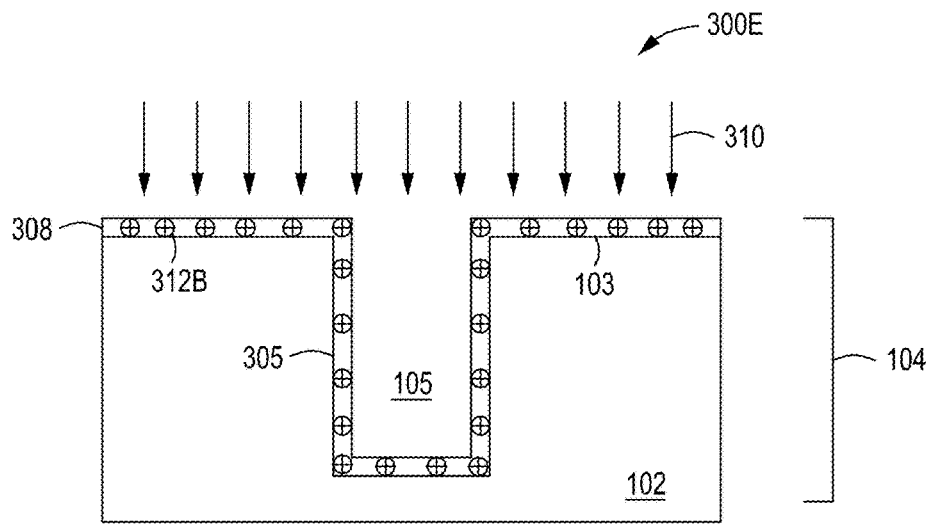
FIG. 3E depicts a cross-sectional view of a deep trench isolation structure after an optional gas doping process of the passivation region in accordance with some embodiments of the present principles.

Optionally, in some embodiments, the passivation region 308 may be formed without dopants which are then introduced via gases 310 as depicted in a view 300E of FIG. 3E. In further optional embodiments, the passivation region 308 may be formed with dopants and then enhanced with additional dopants by exposure to gases. The substrate 102 is exposed to gases 310 including dopants 312B that embed in the passivation region 308 on the field 103 of the substrate 102 and the surfaces 305 of the deep trench 105. The dopants 312B (as shown) in FIG. 3E have a positive charge for the sake of brevity and is not meant to be limiting. The dopants 312B may also have a negative charge (not shown). Gases 310 can also incorporate species such as Ge, carbon, for material engineering purposes on composition, energy band, light sensitivity, etc. The density of the dopants 312B and/or the type of the dopants 312B may be adjusted to provide a given plus or minus charge level as required for the DTI structure 104.

Figure 3F:
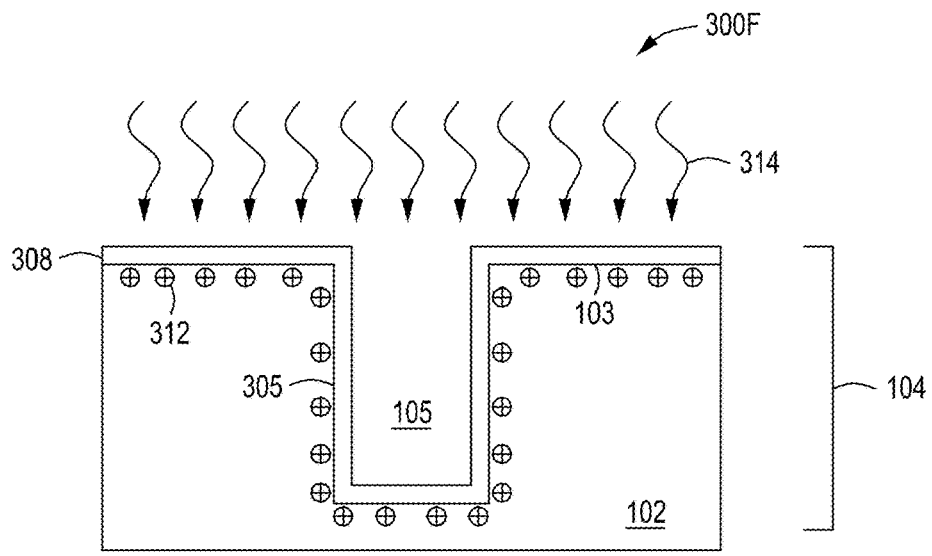
FIG. 3F depicts a cross-sectional view of a deep trench isolation structure after an anneal process to further embed dopants in accordance with some embodiments of the present principles.

In block 208, a work function of the passivation region 308 can be altered as depicted in a view 300F of FIG. 3F. The dopants 312 are further embedded into the material of the substrate 102 by a dopant diffusion process 314. In some embodiments, the dopant diffusion process 314 may be a millisecond anneal process that uses high power and high temperature lasers (e.g., 700 degrees Celsius to 900 degrees Celsius) that are pulsed in the millisecond range to anneal the substrate 102 without heating the substrate to high temperatures. In some embodiments, the dopant diffusion process 314 could be an oxidation process in which dopant or composition diffusion from the passivation region 308 into the substrate 102 occurs upon changing the material composition of the passivation region 308 to oxide. The process is the same method as the second approach mentioned in block 206 for the passivation region 308 formation and can be combined. The dopant diffusion process 314 yields an abrupt charge boundary in the material of the substrate 102 that increases the effective pixel area of an adjacent optical pixel as opposed to conventional techniques that form a large region of gradient charge. In some embodiments, the abrupt charge boundary or abrupt charge passivation region has a charge formation of plus or minus approximately $3e18/cm^3$ to approximately $3e21/cm^3$. The increased effective pixel area can provide enhanced pixel performance that enables HDR and the like.

Figure 3G:
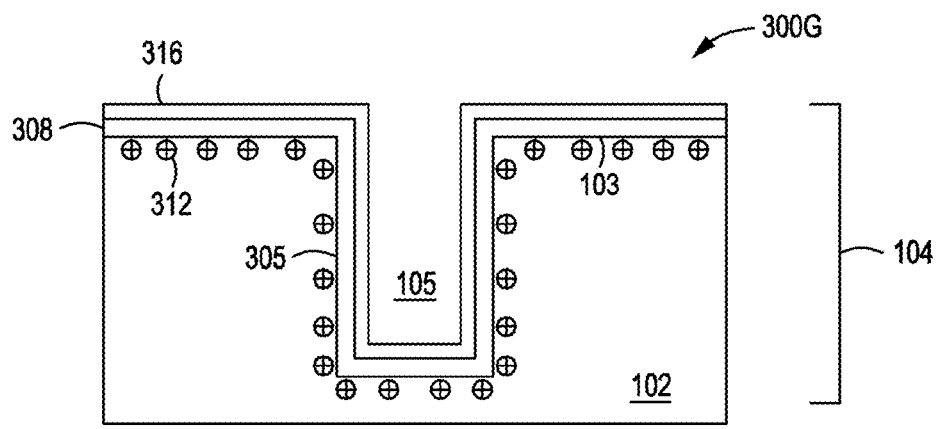
FIG. 3G depicts a cross-sectional view of a deep trench isolation structure after formation of a conformal liner layer in accordance with some embodiments of the present principles.
Figure 3H:
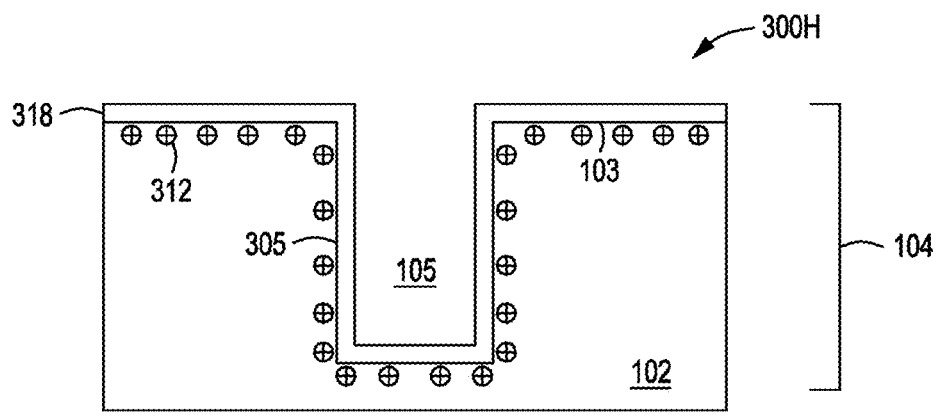
FIG. 3H depicts a cross-sectional view of a deep trench isolation structure after an alternative method of formation of a conformal liner layer in accordance with some embodiments of the present principles.

In block 210, a barrier or liner layer 316 is formed on the passivation region 308 as depicted in a view 300G of FIG. 3G. The liner layer 316 can be an oxide layer or compositions with a metal diffusion blocking function that is deposited on the passivation region 308. In some embodiments, the liner layer 316 is silicon dioxide. The liner layer 316 prevents migration into the substrate 102 of reflective material that is subsequently used to fill the deep trench 105. In some embodiments, the liner layer 316 may be deposited by atomic layer deposition (ALD) processes and the like. The liner layer 316 may also function as an etch stop layer. In an alternative embodiment, the epitaxial growth material of the passivation region 308 can be oxidized after dopant implantation by condensation to both drive the dopants further into the material of the substrate 102 and form an oxidation layer 318 as depicted in a view 300H of FIG. 3H. In effect, the passivation region 308 produces a liner layer 318 and embedded charge region without an anneal process such as the millisecond anneal process discussed above. In addition, the epitaxial growth for the alternative embodiment can be polymorphous rather than single crystal growth.

Figure 3I:
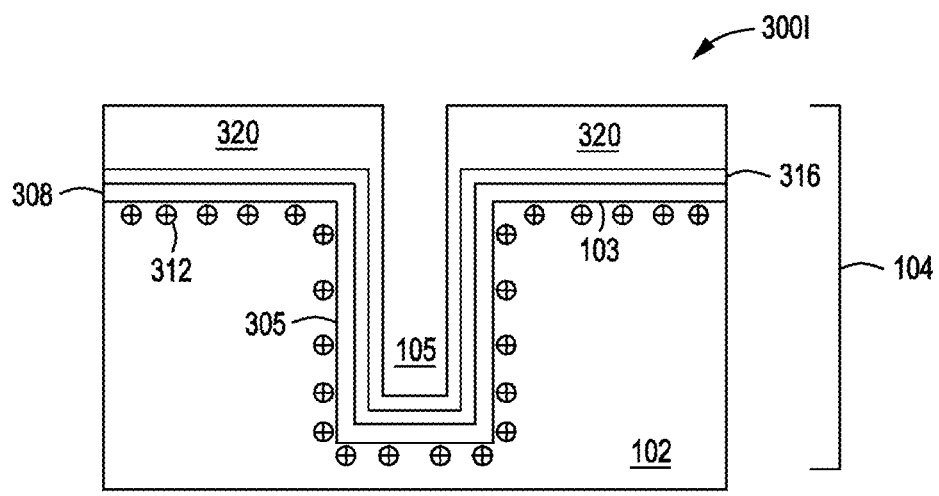
FIG. 3I depicts a cross-sectional view of a deep trench isolation structure after formation of an optically refractive layer in accordance with some embodiments of the present principles.
Figure 3J:
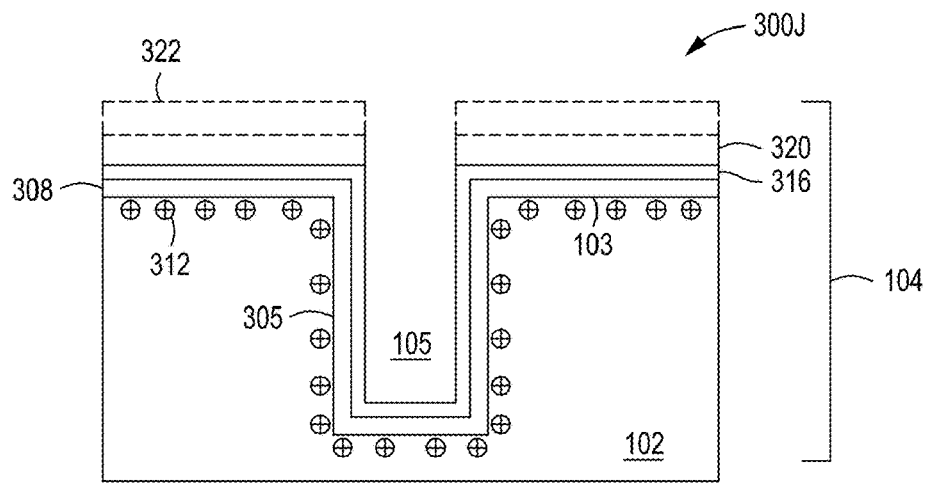
FIG. 3J depicts a cross-sectional view of a deep trench isolation structure after selective removal of a portion of an optically refractive layer in accordance with some embodiments of the present principles.

In block 212, a refractive layer 320 is deposited on the substrate 102 as depicted in a view 300I of FIG. 3I. In some embodiments, the deposition process of the refractive layer 320 is anisotropic and produces a thicker layer on the field 103 of the substrate 102 than on the surfaces 305 of the deep trench 105. In block 214, the refractive layer 320 is selectively removed from inside of the deep trench 105 as depicted in a view 300J of FIG. 3J. The thickness of the material of the refractive layer 320 on the field 103 of the substrate 102 may be reduced during the selective removal process. The refractive layer 320 within the deep trench 105 is completely removed, exposing the liner layer 316 inside the deep trench 105. In some embodiments, an optional photolithography mask 322 may be used to mask the refractive layer 320 prior to the selective removal process, maintaining the deposition thickness of the refractive layer 320 on the field 103 of the substrate 102. In some embodiments, the reflective material fill process may be performed prior to the deposition process of the refractive material such that the refractive material is deposited on the reflective material, eliminating the selective removal of the refractive material from inside of the deep trench 105. The deposition of the reflective material is discussed below.

Figure 3K:
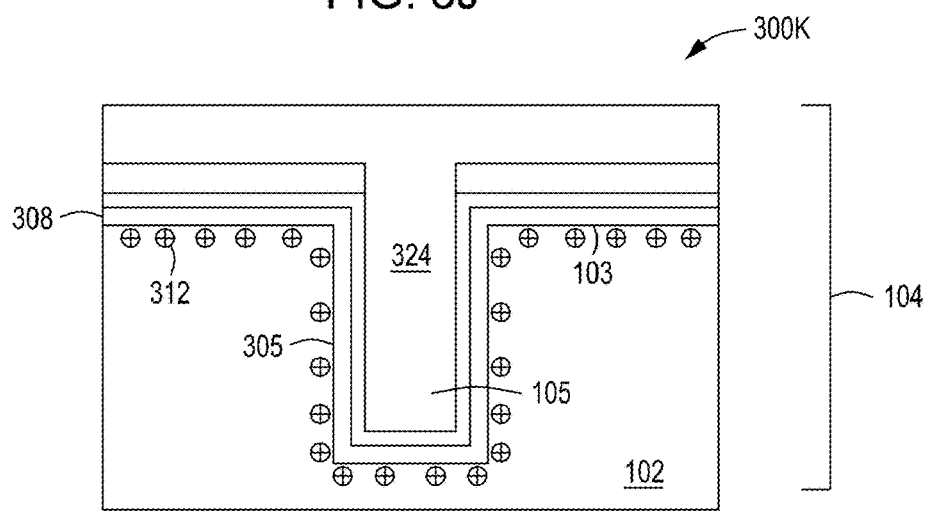
FIG. 3K depicts a cross-sectional view of a deep trench isolation structure after filling with an optically reflective material in accordance with some embodiments of the present principles.
Figure 3L:
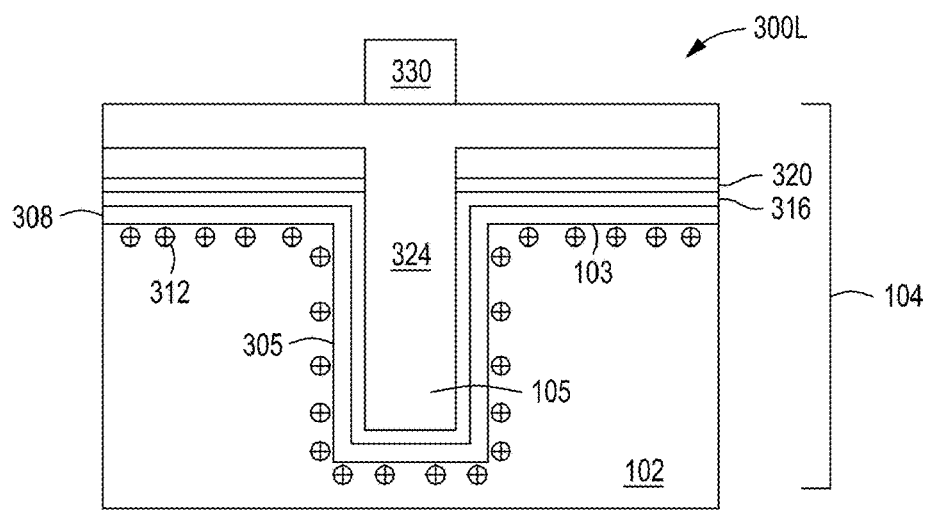
FIG. 3L depicts a cross-sectional view of a deep trench isolation structure after patterning of an optically reflective material in accordance with some embodiments of the present principles.
Figure 3M:
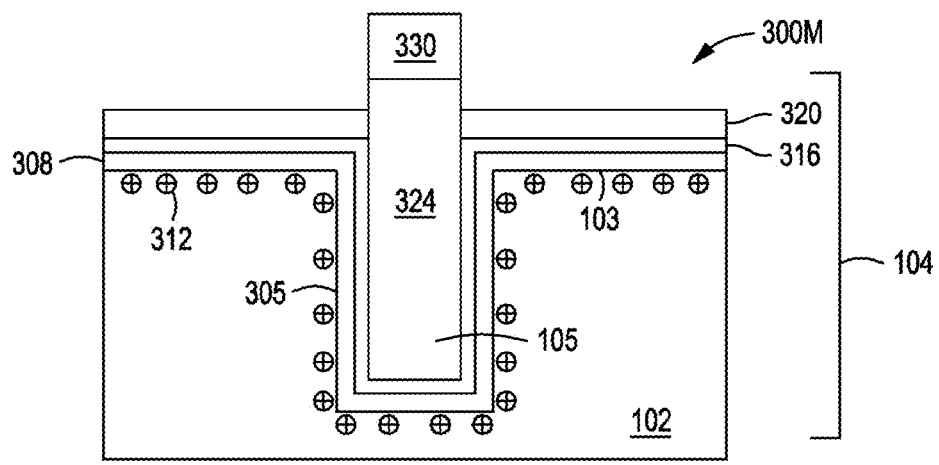
FIG. 3M depicts a cross-sectional view of a deep trench isolation structure after removal of portions of an optically reflective material from a field of a substrate in accordance with some embodiments of the present principles.
Figure 3N:
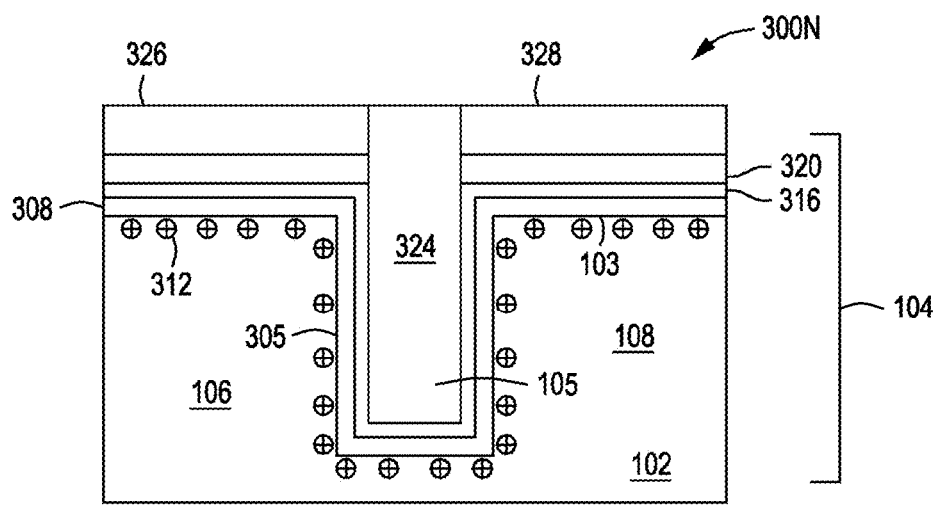
FIG. 3N depicts a cross-sectional view of a deep trench isolation structure after forming a color filter layer or an optical barrier layer on a field of a substrate in accordance with some embodiments of the present principles.

In block 216, a reflective material 324 is deposited in the deep trench and on the substrate 102, filling the deep trench 105 and forming a layer on the field 103 of the substrate 102 as depicted in a view 300K of FIG. 3K. In some embodiments, the reflective material 324 may be, for example, aluminum or any reflective material and the like. In some embodiments, the reflective material 324 may be deposited using chemical vapor deposition (CVD) processes and the like. In block 218, a pattern 330 is formed on the reflective material 324 on the substrate 102 as depicted in a view 300L of FIG. 3L. The reflective material 324 is then etched to remove the reflective material 324 on the field 103 of the substrate 102, exposing the refractive layer 320 as depicted in a view 300M of FIG. 3M. The pattern 330 is then removed after the etching process has been completed. In block 220, a color filter layer 326 and/or an optical barrier layer 328 is formed on the refractive layer 320 on the substrate as depicted in a view 300N of FIG. 3N. The color filter layer 326 filters wavelengths of light based on the intended purpose of the underlying optical pixels 106. The optical barrier layer 328 prevents penetration of light into the non-pixel area 108 to reduce/eliminate unwanted photons from entering into adjacent pixel structures and the like.

Figure 6:
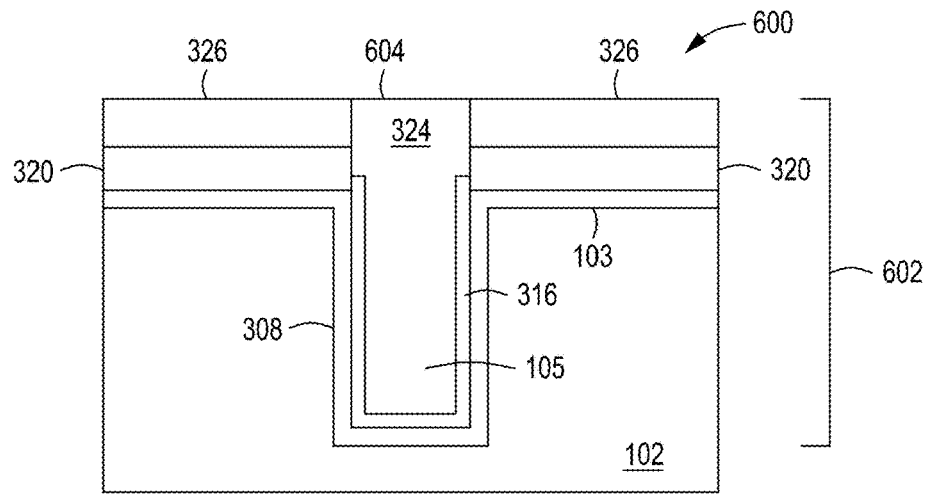
FIG. 6 depicts a structure formed using techniques in accordance with some embodiments of the present principles.

A view 600 of FIG. 6 depicts a structure 602 formed using techniques in accordance with some embodiments of the present principles. The present methods allow the structure 602 to be formed with the reflective material 324 central to the deep trench 105 in the substrate 102 and with the liner layer 316 surrounding the reflective material 324 in the deep trench 105. The reflective material 324 is exposed at an upper end 604 that is also flanked by the refractive layer 320 under the color filter layer 326. The structure 602 enhances performance of adjacent pixel structures because only reflective material is used inside of the deep trench 105 to reflect light internally back to the pixel structures and refractive material is found only on top of the structure 602 to direct (refract) light into the adjacent pixel structures. Conventional DTI structures include both reflective and refractive materials inside of the trench and/or surrounding the trench which lowers performance of the DTI structures and subsequently the performance of pixel structures adjacent to the DTI structures.

Figure 4:
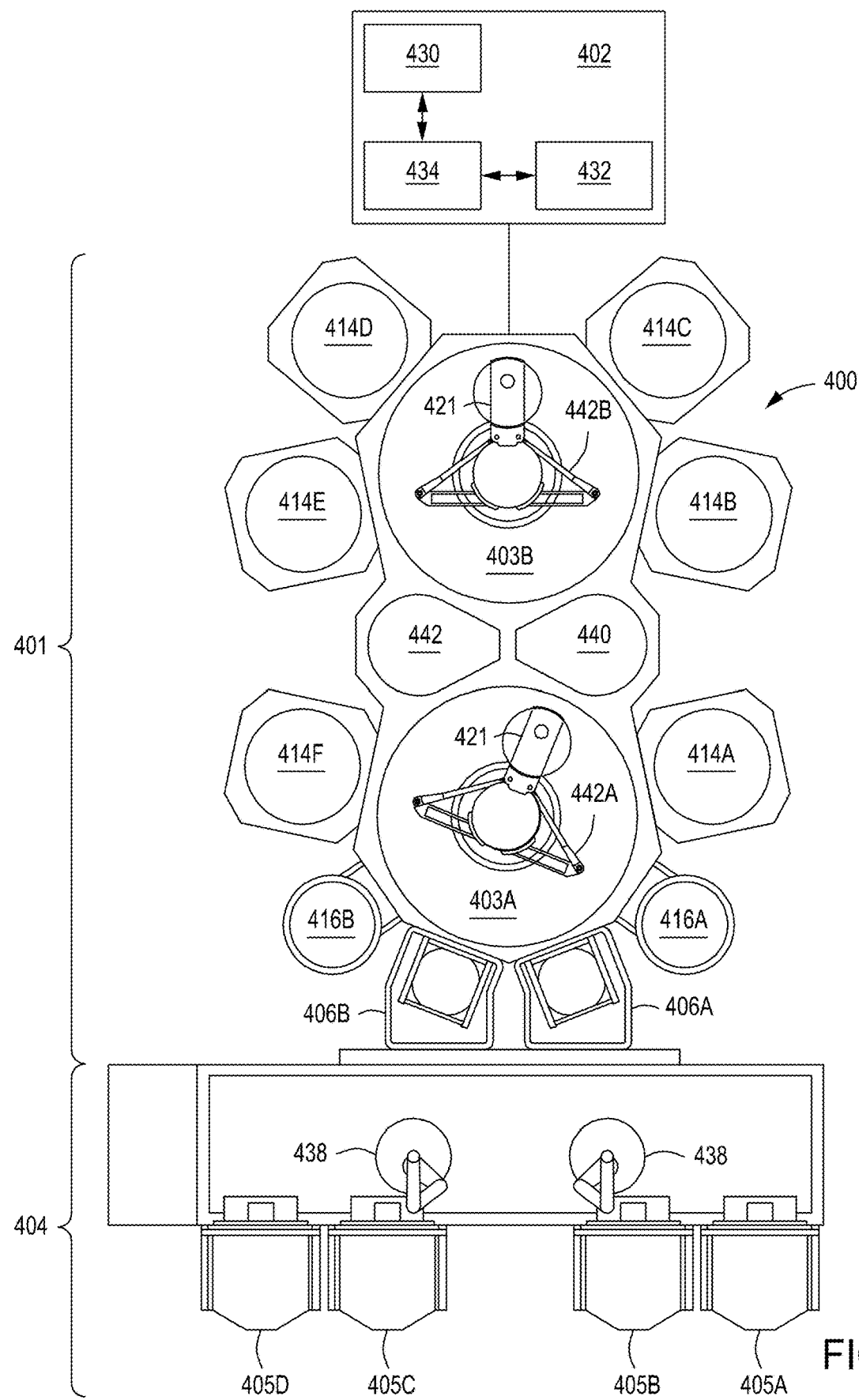
FIG. 4 depicts an integrated tool in accordance with some embodiments of the present principles.

The methods described herein may be performed in individual process chambers that may be provided in a standalone configuration or as part of a cluster tool, for example, an integrated tool 400 (i.e., cluster tool) described below with respect to FIG. 4. The advantage of using an integrated tool 400 is that there is no vacuum break and, therefore, no requirement to degas and pre-clean a substrate before treatment in a chamber. For example, in some embodiments the inventive methods discussed above may advantageously be performed in an integrated tool such that there are limited or no vacuum breaks between processes, limiting or preventing contamination of the substrate. The integrated tool 400 includes a vacuum-tight processing platform 401, a factory interface 404, and a system controller 402. The processing platform 401 comprises multiple processing chambers, such as 414A, 414B, 414C, 414D, 414E, and 414F operatively coupled to a vacuum substrate transfer chamber (transfer chambers 403A, 403B). The factory interface 404 is operatively coupled to the transfer chamber 403A by one or more load lock chambers (two load lock chambers, such as 406A and 406B shown in FIG. 4).

In some embodiments, the factory interface 404 comprises at least one docking station 407, at least one factory interface robot 438 to facilitate the transfer of the semiconductor substrates. The docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the load lock chambers, such as 406A and 406B. Each of the load lock chambers 406A and 406B have a first port coupled to the factory interface 404 and a second port coupled to the transfer chamber 403A. The load lock chamber 406A and 406B are coupled to a pressure control system (not shown) which pumps down and vents the load lock chambers 406A and 406B to facilitate passing the substrates between the vacuum environment of the transfer chamber 403A and the substantially ambient (e.g., atmospheric) environment of the factory interface 404. The transfer chambers 403A, 403B have vacuum robots 442A, 442B disposed in the respective transfer chambers 403A, 403B. The vacuum robot 442A is capable of transferring substrates 421 between the load lock chamber 406A, 406B, the processing chambers 414A and 414F and a cooldown station 440 or a pre-clean station 442. The vacuum robot 442B is capable of transferring substrates 421 between the cooldown station 440 or pre-clean station 442 and the processing chambers 414B, 414C, 414D, and 414E.

In some embodiments, the processing chambers 414A, 414B, 414C, 414D, 414E, and 414F are coupled to the transfer chambers 403A, 403B. The processing chambers 414A, 414B, 414C, 414D, 414E, and 414F may comprise, for example, an atomic layer deposition (ALD) process chamber, a physical vapor deposition (PVD) process chamber, chemical vapor deposition (CVD) chambers, annealing chambers, or the like. The chambers may include any chambers suitable to perform all or portions of the methods described herein, as discussed above, such as a dry oxide removal chamber or pre-clean chamber and an epitaxial growth chamber along with etching and deposition chambers. In some embodiments, one or more optional service chambers (shown as 416A and 416B) may be coupled to the transfer chamber 403A. The service chambers 416A and 416B may be configured to perform other substrate processes, such as degassing, orientation, substrate metrology, cool down and the like.

The system controller 402 controls the operation of the tool 400 using a direct control of the process chambers 414A, 414B, 414C, 414D, 414E, and 414F or alternatively, by controlling the computers (or controllers) associated with the process chambers 414A, 414B, 414C, 414D, 414E, and 414F and the tool 400. In operation, the system controller 402 enables data collection and feedback from the respective chambers and systems to optimize performance of the tool 400. The system controller 402 generally includes a Central Processing Unit (CPU) 430, a memory 434, and a support circuit 432. The CPU 430 may be any form of a general-purpose computer processor that can be used in an industrial setting. The support circuit 432 is conventionally coupled to the CPU 430 and may comprise a cache, clock circuits, input/output subsystems, power supplies, and the like. Software routines, such as a method as described above may be stored in the memory 434 and, when executed by the CPU 430, transform the CPU 430 into a specific purpose computer (system controller) 402. The software routines may also be stored and/or executed by a second controller (not shown) that is located remotely from the tool 400.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of forming a deep trench isolation (DTI) structure in a substrate, comprising:
    etching a trench with a high aspect ratio into a substrate material;
    repairing surfaces of the trench from damage caused by etching of the trench;
    growing an epitaxial layer on surfaces of the trench to form a homogeneous passivation region as part of the substrate material;
    doping the epitaxial layer with an additional dopant to engineer a passivation charge region;
    performing a charge diffusion process to embed the additional dopant into the substrate material to form an abrupt charge passivation region in the substrate material;
    forming a conformal liner layer or a conformal barrier layer directly on the homogeneous passivation region in the trench; and
    filling the trench with an optically reflective material after the charge diffusion process is performed.

2. The method of claim 1, wherein the charge diffusion process is a millisecond anneal process.

3. The method of claim 1, further comprising:
    repairing surfaces of the trench by:
        forming a dry oxide on surfaces of the trench at temperatures of less than 450 degrees Celsius; and selectively removing the dry oxide from surfaces of the trench.

4. The method of claim 1, wherein the additional dopant is boron.

5. The method of claim 1, wherein the conformal liner layer or the conformal barrier layer is silicon dioxide.

6. The method of claim 1, wherein the homogeneous passivation region is formed by single crystal epitaxial growth or by oxidizing non-crystal doped material.

7. The method of claim 6, further comprising:
oxidizing the epitaxial layer or the non-crystal doped material with the additional dopant in a condensation process to embed the additional dopant and to form the conformal liner layer or the conformal barrier layer.

8. The method of claim 1, further comprising:
depositing a refractive layer on the conformal liner layer or the conformal barrier layer before filling the trench with the optically reflective material; and
selectively removing a portion of the refractive layer from inside of the trench before filling the trench with the optically reflective material.

9. The method of claim 8, further comprising:
removing portions of the optically reflective material from a field of the substrate using a patterning process after filling the trench with the optically reflective material.

10. The method of claim 9, further comprising:
forming a color filter layer or an optical barrier layer on the field of the substrate.

11. A non-transitory, computer readable medium having instructions stored thereon that, when executed, cause a method for forming a deep trench isolation (DTI) structure in a substrate to be performed, the method comprising:
etching a trench of the DTI structure with a high aspect ratio into a substrate material;
repairing surfaces of the trench from damage caused by etching of the trench;
growing an epitaxial layer on surfaces of the trench to form a homogeneous passivation region of the DTI structure as part of the substrate material;
doping the epitaxial layer with a dopant to form a passivation charge region of the DTI structure;
performing a charge diffusion process to embed the dopant into the substrate material to form an abrupt charge passivation region in the substrate material;
forming a conformal liner layer of the DTI structure directly on the homogeneous passivation region in the trench; and
filling the trench with an optically reflective material after the charge diffusion process is performed.

12. The non-transitory, computer readable medium of claim 11, wherein the method further comprises:
depositing a refractive layer on the conformal liner layer before filling the trench with the optically reflective material;
selectively removing a portion of the refractive layer from inside of the trench before filling the trench with the optically reflective material;
removing portions of the optically reflective material from a field of the substrate using a patterning process after filling the trench with the optically reflective material; and
forming a color filter layer or an optical barrier layer on the field of the substrate after performing the patterning process.

13. The non-transitory, computer readable medium of claim 11, wherein the method further comprises:
repairing the surfaces of the trench by:
forming a dry oxide on the surfaces of the trench at temperatures of less than 450 degrees Celsius; and
selectively removing the dry oxide from the surfaces of the trench; and
using a millisecond anneal process as the charge diffusion process,
wherein the dopant is boron, the conformal liner layer is silicon dioxide, and the epitaxial layer is formed of single crystals.

* * * * *